United States Patent
Noguchi et al.

(10) Patent No.: US 9,363,118 B2
(45) Date of Patent: Jun. 7, 2016

(54) NON-CONTACT POWER SUPPLY TRANSMITTER SYSTEM, RECEIVING DEVICE, AND ANALOG CIRCUIT

(71) Applicant: ROHM CO., LTD., Kyoto (JP)

(72) Inventors: Takashi Noguchi, Kyoto (JP); Tatsuya Iwasaki, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 14/457,494

(22) Filed: Aug. 12, 2014

(65) Prior Publication Data

US 2015/0049833 A1   Feb. 19, 2015

(30) Foreign Application Priority Data

Aug. 13, 2013   (JP) .................. 2013-168016

(51) Int. Cl.
| | |
|---|---|
| H04L 27/12 | (2006.01) |
| H04L 27/14 | (2006.01) |
| H04B 5/00 | (2006.01) |
| H04L 25/02 | (2006.01) |
| H03D 3/00 | (2006.01) |
| H03C 3/00 | (2006.01) |

(52) U.S. Cl.
CPC ............. H04L 27/12 (2013.01); H04B 5/0037 (2013.01); H04B 5/0075 (2013.01); H04B 5/0093 (2013.01); H04L 25/0268 (2013.01); H04L 27/14 (2013.01); H03C 3/00 (2013.01); H03D 3/00 (2013.01)

(58) Field of Classification Search
USPC .................. 375/272, 303, 324, 334
See application file for complete search history.

(56) References Cited

U.S. PATENT DOCUMENTS

| | | | | |
|---|---|---|---|---|
| 5,548,619 | A | * | 8/1996 | Horiike et al. ............... 375/344 |
| 5,633,898 | A | * | 5/1997 | Kishigami et al. ........... 375/344 |
| 6,529,127 | B2 | * | 3/2003 | Townsend et al. ........... 340/505 |

FOREIGN PATENT DOCUMENTS

| | | |
|---|---|---|
| JP | 2012080772 A | 4/2012 |
| JP | 201338854 A | 2/2013 |

* cited by examiner

*Primary Examiner* — Kabir A Timory
(74) *Attorney, Agent, or Firm* — Cantor Colburn LLP

(57) ABSTRACT

A non-contact power supply transmitter system 100 transmitting an electric power from a transmitting device (TX) 200 to a receiving device (RX) 300 with a non-contact power supply transmitter method, the TX 200 including: a transmitting coil 202; a driver 204 causing the transmitting coil 202 to generate a power signal of the electromagnetic field; and an FSK modulation unit 240 transmitting an FSK signal Sf through the transmitting coil 202, the RX 300 including: a receiving coil 302; an FSK demodulation unit 330 demodulating the FSK signal Sf received through the receiving coil 302; and a controller 312 inputting the FSK signal demodulated by the FSK demodulation unit 330, the FSK demodulation unit 330 is composed of an analog circuit. The non-contact power supply transmitter system, the receiving device, and the analog circuit can realize a low power, space-saving FSK communication.

10 Claims, 7 Drawing Sheets

FSK ORIGINAL SIGNAL Sf0

RECTANGULAR WAVE Sf1

F/V CONVERTED WAVEFORM Sf2

BAND-PASS FILTERED WAVEFORM Sf3

AMPLIFIED WAVEFORM Sf4

FSK OUTPUT WAVEFORM Sf5

NON-CONTACT POWER SUPPLY TRANSMITTER SYSTEM, RECEIVING DEVICE, AND ANALOG CIRCUIT

CROSS REFERENCE TO RELATED APPLICATIONS

This application is based upon and claims the benefit of priority from prior Japanese Patent Application No. 2013-168016 filed on Aug. 13, 2013, the entire contents of which are incorporated herein by reference.

FIELD

An embodiment described herein relates to a non-contact power supply transmitter system, a receiving device, and an analog circuit.

BACKGROUND

In recent years, there is beginning to spread a non-contact power supply transmitter methods (it is also called a wireless power supply transmitter method or a contactless power transmission method.) for supplying power to electronic apparatuses, e.g. mobile phoned, tablet-type devices, etc. In order to promote interoperation between products of which manufacturers are different from each other, Wireless Power Consortium (WPC) was organized, and then the Qi standard which is the International Standard was developed by WPC.

Such a non-contact power supply transmitter system includes a transmitting device (TX) and a receiving device (RX). Communication between the transmitting device (TX) and the receiving device (RX) is executed via a rectification waveform. The communication from the transmitting device (TX) to the receiving device (RX) is executed with a Frequency Shift Keying (FSK) signal.

SUMMARY

An FSK signal used in non-contact power transmitter ICs needs to convert a variation in several μsec into a binary signal of "0" or "1" with respect to fundamental frequencies from 110 kHz to 205 kHz. Accordingly, in order to recognize such a variation in several μsec, a high-frequency sampling clock, a switched capacitor method, etc. are adopted, but there is a problem that electric power consumption and a circuit scale are increased as well as clock control being complicated, according to such conventional technologies.

The embodiment described herein provides a non-contact power supply transmitter system, a receiving device, and an analog circuit, each which can realize a low power, space-saving FSK communication.

According to one aspect of the embodiment, there is provided a non-contact power supply transmitter system configured to transmit an electric power from a transmitting device to a receiving device with a non-contact power supply transmitter method, the transmitting device comprising: a transmitting coil; a driver configured to cause the transmitting coil to generate a power signal of an electromagnetic field; and an FSK modulation unit configured to transmit an FSK signal through the transmitting coil, the receiving device comprising: a receiving coil; an FSK demodulation unit configured to demodulate the FSK signal received through the receiving coil; and a controller configured to input the FSK signal demodulated by the FSK demodulation unit, wherein the FSK demodulation unit is composed an analog circuit.

According to another aspect of the embodiment, there is provided a receiving device configured so that an electric power is transmitted from a transmitting device thereto with a non-contact power supply transmitter method, the receiving device comprising: a receiving coil; an FSK demodulation unit configured to demodulate the FSK signal received through the receiving coil; and a controller configured to input the FSK signal demodulated by the FSK demodulation unit, wherein the FSK demodulation unit is composed an analog circuit.

According to still another aspect of the embodiment, there is provided an analog circuit configured to demodulate an FSK signal, the analog circuit comprising: an F/V conversion circuit configured to convert a variation in an input frequency into voltage; a band pass filter configured to output the variation in the input frequency; and an output determining circuit configured to output an existence or nonexistence of the variation in the input frequency as a signal of "0" or "1."

According to the embodiment, there can be provided the non-contact power supply transmitter system, the receiving device, and the analog circuit, each which can realize the low power, space-saving FSK communication.

DESCRIPTION OF EMBODIMENTS

Figure 1:
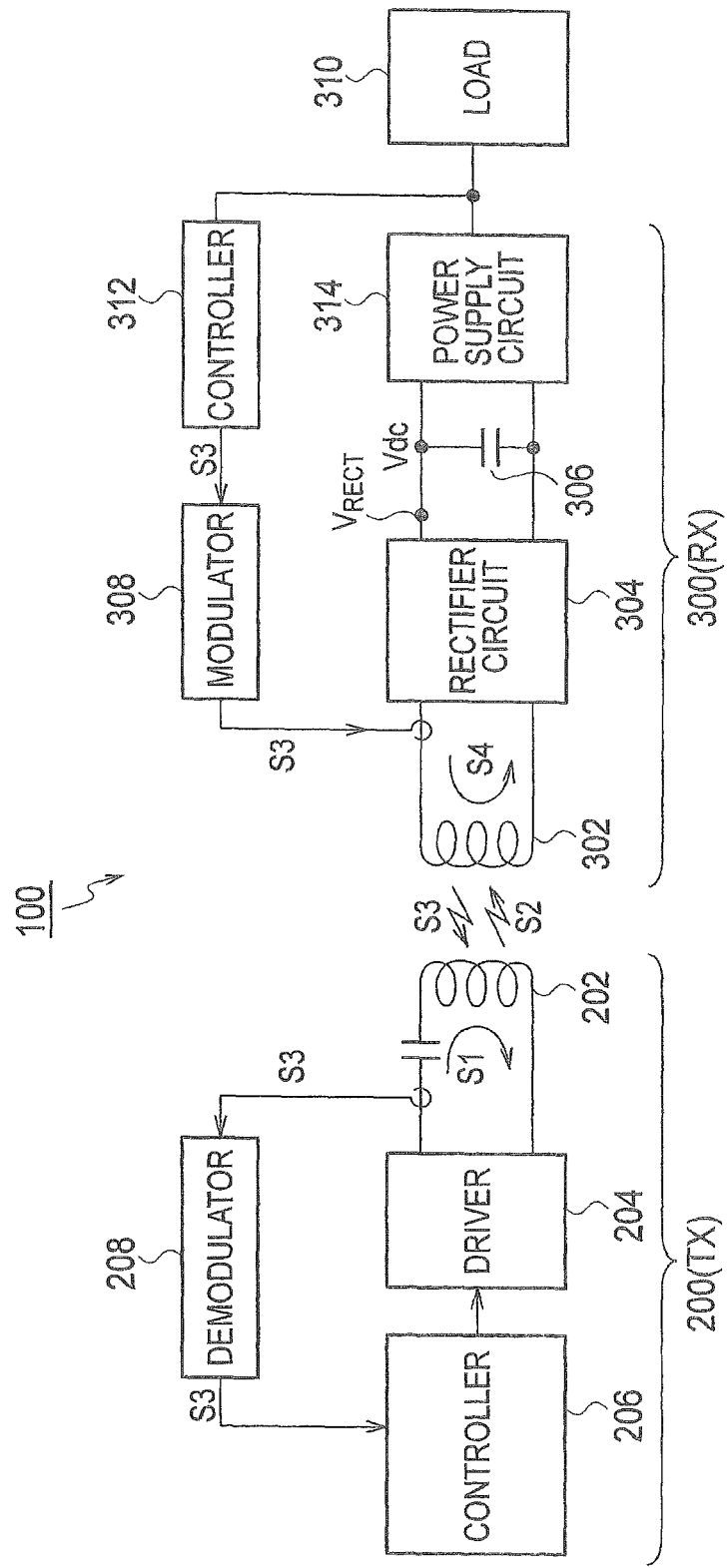
FIG. 1 is a schematic block configuration diagram of a non-contact power supply transmitter system according to a basic technology.

Next, certain embodiments will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiment shown hereinafter exemplifies the apparatus and method for materializing the technical idea; and the embodiment does not specify the material, shape, structure, placement, etc. of each component part as the following. The embodiment may be changed without departing from the spirit or scope of claims.

(Basic Technology: Non-Contact Power Supply Transmitter System)

FIG. 1 shows a schematic block configuration of a non-contact power supply transmitter system 100 according to a basic technology. As shown in FIG. 1, the non-contact power supply transmitter system 100 is a system adheres to the Qi standard, and includes a transmitting device (TX) 200 and a receiving device (RX) 300.

The transmitting device (TX) 200 includes a transmitting coil (primary coil) 202, a driver 204, a controller 206, and a demodulator 208. The driver 204 includes an H bridge circuit (full bridge circuit) or a half bridge circuit. The driver 204 applies a driving signal S1 (more specifically, pulse signal) to the transmitting coil 202, and then causes the transmitting coil 202 to generate a power signal S2 of an electromagnetic field with a driving current flowing into the transmitting coil 202. The controller 206 comprehensively controls the whole of the transmitting device (TX) 200. More specifically, the controller 206 changes transmission power by controlling a switching frequency of the driver 204, or a duty cycle ratio of switching.

The Qi standard defines a communications protocol between the transmitting device (TX) 200 and the receiving device (RX) 300, and can transfer information according to the control signal S3 from the receiving device (RX) 300 to the transmitting device (TX) 200. The control signal S3 is transmitted in the form of being modulated with the Amplitude Modulation (AM) using a backscatter modulation from the receiving coil (secondary coil) 302 to the transmitting coil 202. The control signal S3 includes power control data for indicating an amount of power supplied to the receiving device (RX) 300, and data for indicating specific information on the receiving device (RX) 300, for example. The demodulator 208 demodulates the control signal S3 included in the electric current or voltage of the transmitting coil 202. The controller 206 controls the driver 204 on the basis of the power control data included in the demodulated control signal S3.

The receiving device (RX) 300 includes a receiving coil 302, a rectifier circuit 304, a capacitor 306, a modulator 308, a load circuit 310, a controller 312, and a power supply circuit 314. The receiving coil 302 receives the power signal S2 from the transmitting coil 202, and transmits the control signal S3 to the transmitting coil 202. The rectifier circuit 304 and the capacitor 306 rectify and smooth an electric current S4 induced by the receiving coil 302 in accordance with the power signal S2, and then convert the rectified and smoothed electric current S4 into DC voltage. The power supply circuit 314 charges a secondary battery (not illustrated) using the power supplied from the transmitting device (TX) 200, or boosts or steps down the DC voltage Vdc, and supplies it to the load circuit 310 and other controller 312. The controller 312 monitors the amount of the power received by the receiving device (RX) 300, and then generates the power control data for indicating the amount of the supplied power in accordance to the monitoring. The modulator 308 modulates the coil current and coil voltage of the transmitting coil 202 by modulating the control signal S3 including the power control data, and modulating the coil current of the receiving coil 302.

(Basic Technology: Operating Sequence)

Figure 2:
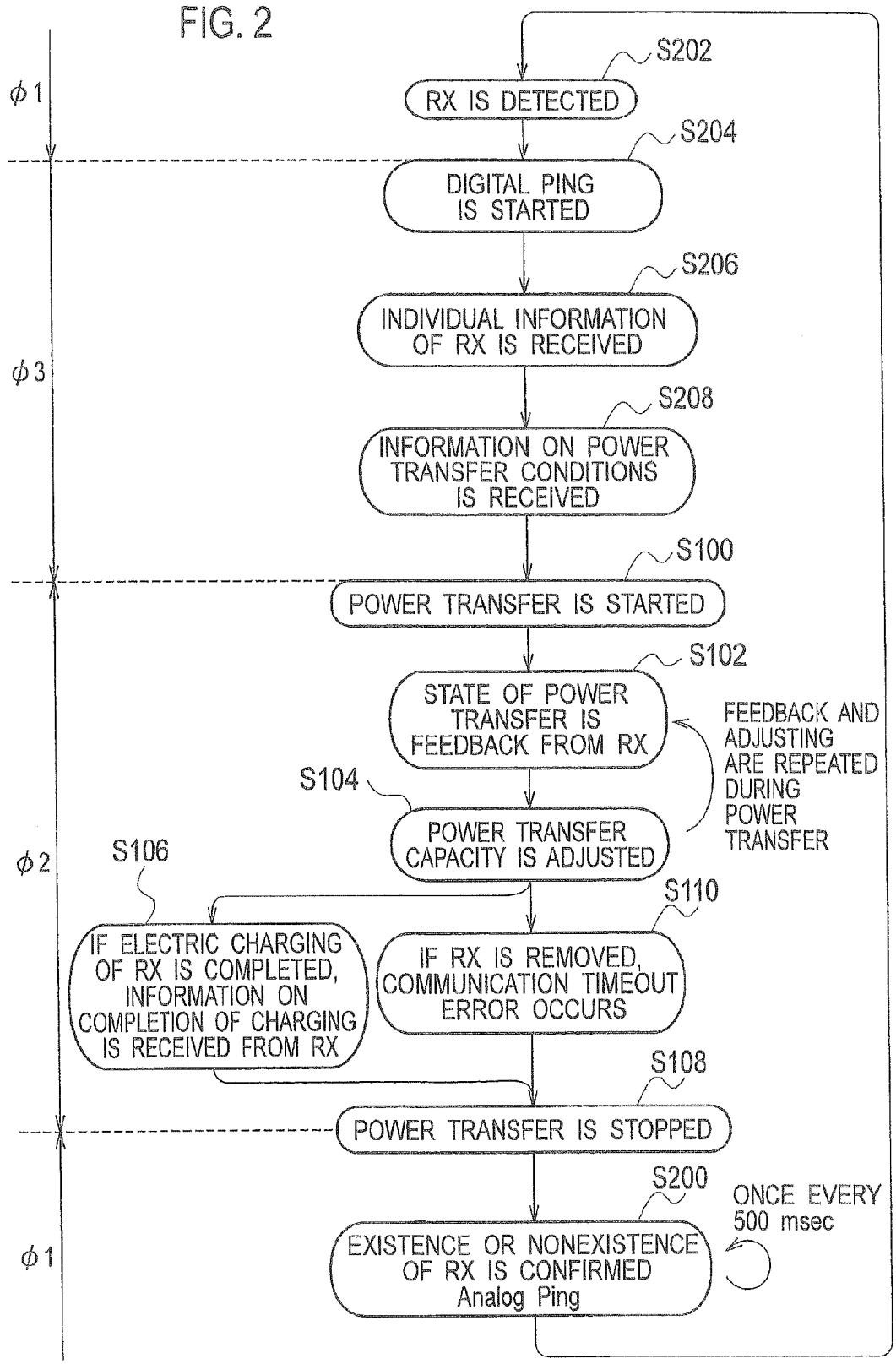
FIG. 2 is an operating sequence diagram showing a transmitting device (TX) in the non-contact power supply transmitter system according to the basic technology.

FIG. 2 shows an operating sequence of the transmitting device (TX) 200 in the non-contact power supply transmitter system 100 according to the basic technology. As shown in FIG. 2, the state of the transmitting device (TX) 200 is classified roughly into a selection phase ϕ1, a power transfer phase ϕ2, and identification & configuration phase ϕ3.

First, the power transfer phase ϕ2 will now be explained. If the power transfer from the transmitting device (TX) 200 to the receiving device (RX) 300 is started (S100), the control signal S3 for indicating the present power transfer state is fed back to the transmitting device (TX) 200 from the receiving device (RX) 300 (S102). Thereby, the transmitting device (TX) 200 adjusts power transfer capacity on the basis of the control signal S3 (S104). The feedback of the control signal S3 and the adjusting of the power transfer capacity are repeated during the power transfer (S102→S104→S102→ . . . ). If the control signal S3 indicating completion of charging is transmitted from the receiving device (RX) 300 to the transmitting device (TX) 200 (S106), or if the receiving device (RX) 300 is removed from the power transmission range of the transmitting device (TX) 200, and thereby a timeout error of communication occurs (S110), the transmitting device (TX) 200 stops the power transfer by detecting the state (S108), and then the state of the transmitting device (TX) 200 is shifted to the selection phase ϕ1.

Next, the selection phase ϕ1 will now be explained. The transmitting device (TX) 200 transmits the power signal S2 at predetermined interval (object detection interval, e.g. 500 msec), and thereby confirms (pings) the existence or nonexistence of the receiving device (RX) 300 (S200). Such a confirmation is called an analog ping phase. If the receiving device (RX) 300 is detected (S202), the state of the transmitting device (TX) 200 is shifted to the identification & configuration phase ϕ3.

Finally, the identification & configuration phase ϕ3 will now be explained. The transmitting device (TX) 200 executes the digital ping phase (S204), and thereby receives individual information of the receiving device (RX) 300 (S206). Subsequently, information regarding power transfer conditions is transmitted from the receiving device (RX) 300 to the transmitting device (TX) 200 (S208), and then the state of the transmitting device (TX) 200 is shifted to the power transfer phase ϕ2.

Comparative Example

Figure 3:
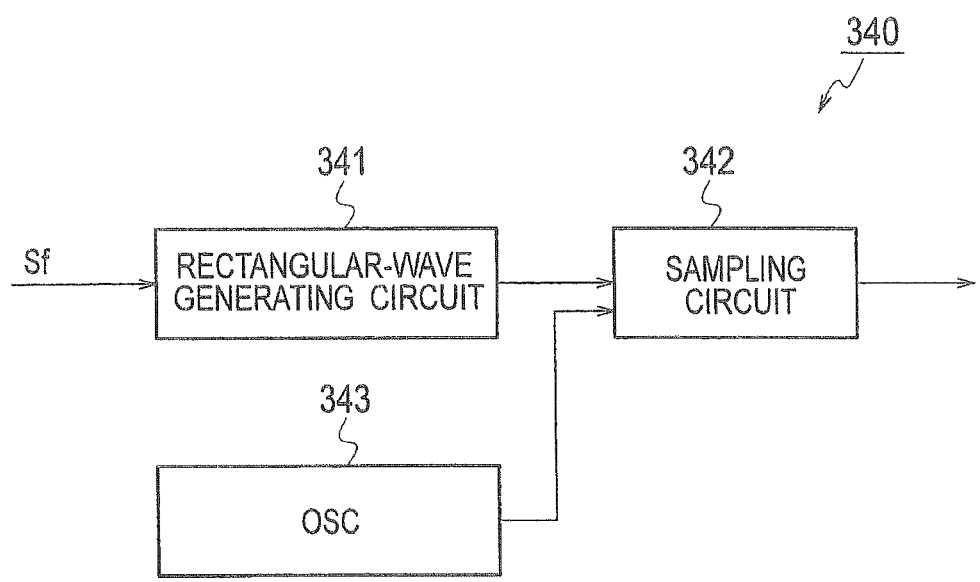
FIG. 3 is a schematic block configuration diagram of an FSK demodulation unit installed in a receiving device (RX) according to a comparative example.

FIG. 3 shows a schematic block configuration of an FSK demodulation unit 340 installed in a receiving device (RX) 300 according to a comparative example. As shown in FIG. 3, the receiving device (RX) 300 includes a rectangular-wave generating circuit 341, a sampling circuit 342, and an OSC 343, and executes the FSK communication between a transmitting device (TX) 200 and the receiving device (RX) 300.

As already explained, the FSK signal used in non-contact power transmitter ICs needs to convert a variation in several μsec into a binary signal of "0" or "1" with respect to fundamental frequencies from 110 kHz to 205 kHz. Therefore, there have been adopted a high-frequency sampling clock, an switched capacitor method, etc., in order to recognize a variation in several μsec. However, since the sampling circuit 342 samples 100 kHz by several MHz, for example, the circuit scale becomes larger. Moreover, although the OSC 343 is executed in MHz, only the FSK demodulation unit 340 uses such a high-frequency clock at the receiving device (RX) 300 side.

Embodiment

Hereinafter, the embodiment will now be described focusing on points different from the basic technology or the comparative example.

Figure 4:
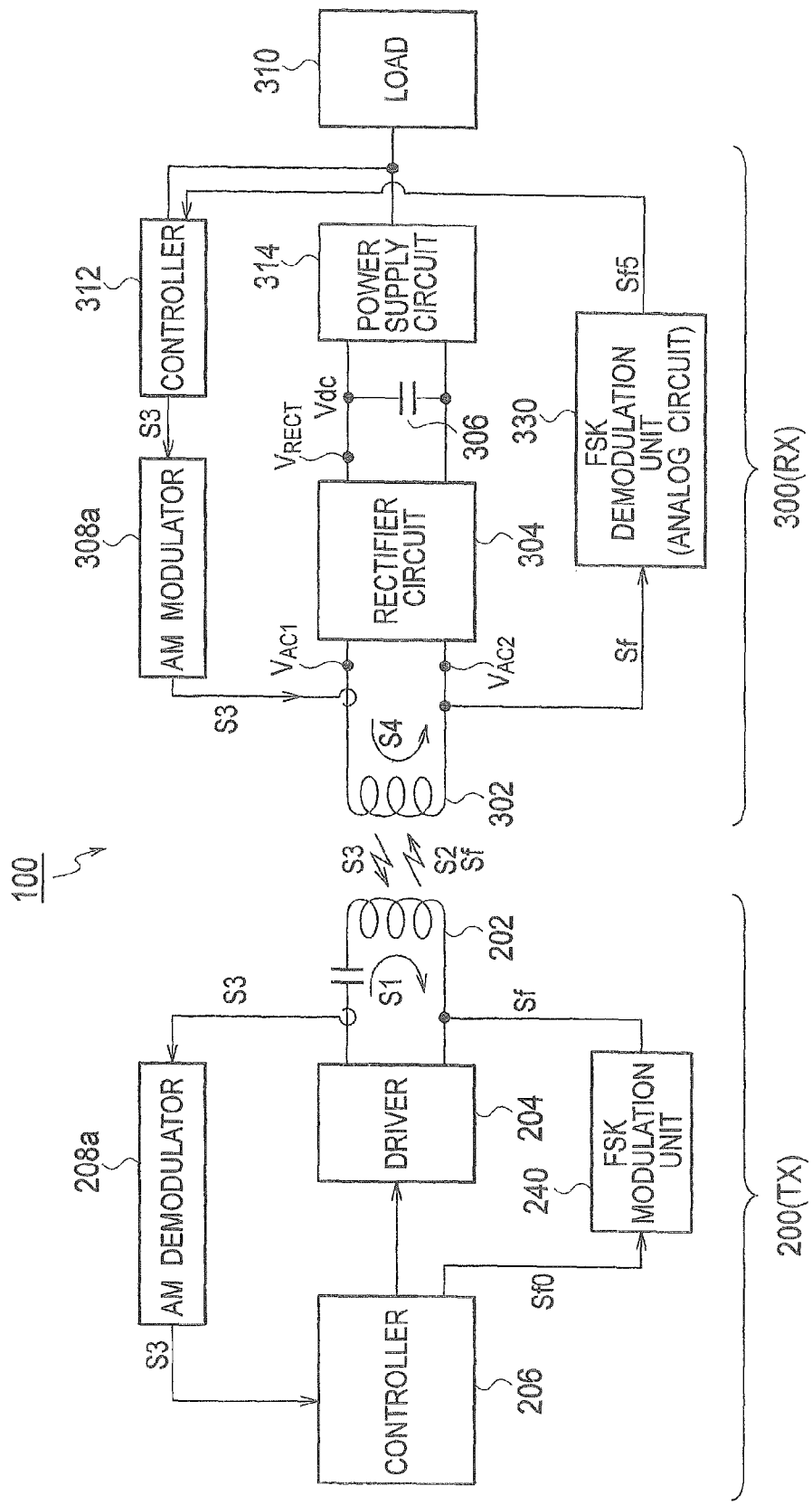
FIG. 4 is a schematic block configuration diagram of a non-contact power supply transmitter system according to the embodiment.

Also in the embodiment, as shown in FIG. 4, it is premised on a non-contact power supply transmitter system 100 configured to execute the FSK communication between the transmitting device (TX) 200 and the receiving device (RX) 300. An FSK modulation unit 240 at the side of the transmitting device (TX) 200 modulates an FSK original signal Sf0 used for an original of FSK signal Sf using the FSK scheme, and then transmits the FSK signal Sf through the transmitting coil 202. An FSK demodulation unit 330 at the side of the receiving device (RX) 300 demodulates the FSK signal Sf included in the electric current or voltage of the receiving coil 302, and then inputs the demodulated FSK signal Sf into a controller 312. In the embodiment, the following configurations are adopted in order to be able to realize the low power, space-saving FSK communication in such a non-contact power supply transmitter system 100.

(Non-Contact Power Supply Transmitter System)

The non-contact power supply transmitter system 100 according to the embodiment is the non-contact power supply transmitter system 100 configured to transmit an electric power from a transmitting device (TX) 200 to a receiving device (RX) 300 with the non-contact power supply transmitter method. The transmitting device (TX) 200 including: a transmitting coil 202; a driver 204 configured to cause the transmitting coil 202 to generate a power signal of the electromagnetic field; and an FSK modulation unit 240 configured to transmit an FSK signal Sf through the transmitting coil 202. The receiving device (RX) 300 including: a receiving coil 302; an FSK demodulation unit 330 configured to demodulate the FSK signal Sf received through the receiving coil 302; and a controller 312 configured to input the FSK signal Sf (Sf5) demodulated by the FSK demodulation unit 330, wherein the FSK demodulation unit 330 is composed of an analog circuit. Hereinafter, the reference numeral 330 same as the FSK demodulation unit 330 may also be used as the reference numeral of the analog circuit.

More specifically, the analog circuit 330 may includes: an F/V conversion circuit 332 configured to convert a variation in an input frequency into voltage; a Band Pass Filter (BPF) 333 configured to output the variation in the input frequency; and an output determining circuit 335 configured to output an existence or nonexistence of the variation in the input frequency as a binary signal of "0" or "1." Thus, the input FSK signal Sf is subjected to F/V conversion, then is passed through the BPF, and is output through an output buffer, thereby recognizing such a variation in several μsec, without using the high-frequency sampling clock.

Moreover, a rectangular-wave generating circuit 331 configured to generate a rectangular wave from an input rectification waveform may be disposed at the previous stage of the F/V conversion circuit 332. Thereby, it becomes easy to process the input rectification waveform (sine wave) at the subsequent stage.

Moreover, an amplifier circuit 334 configured to amplify the variation in the input frequency may be disposed at the previous stage of the output determining circuit 335. Thereby, since the variation in the input frequency is amplified, the accuracy of the FSK demodulation can be improved.

Moreover, a gain control circuit 336 configured to control a gain of the F/V conversion circuit 332 in accordance with the input fundamental frequency may be disposed. Thereby, the F/V conversion circuit 332 can be operated with respect to a total range of the fundamental frequencies.

Moreover, the FSK communication may be executed after the identification & configuration phase φ3 between the transmitting device (TX) 200 and the receiving device (RX) 300, and before the power transfer phase φ2 from the transmitting device (TX) 200 to the receiving device (RX) 300.

Moreover, the receiving device (RX) 300 may be mounted in any one of non-contact power transmitter ICs, mobile phones, tablet-type devices, smart phones, audio players, or game machines.

The function of the AM modulator 308a installed in the receiving device (RX) 300 is the similar to that of the modulator 308 according to the basic technology. More specifically, the AM modulator 308a modulates the coil current and the coil voltage of the transmitting coil 202 by modulating the coil current of the receiving coil 302.

The function of the AM demodulator 208a installed in the transmitting device (TX) 200 is the similar to that of the demodulator 208 according to the basic technology. More specifically, the AM demodulator 208a demodulates the AM-modulated signal included in the electric current or the voltage of the transmitting coil 202, and then supplies the demodulated signal to the controller 206.

(Operating Sequence)

Figure 5:
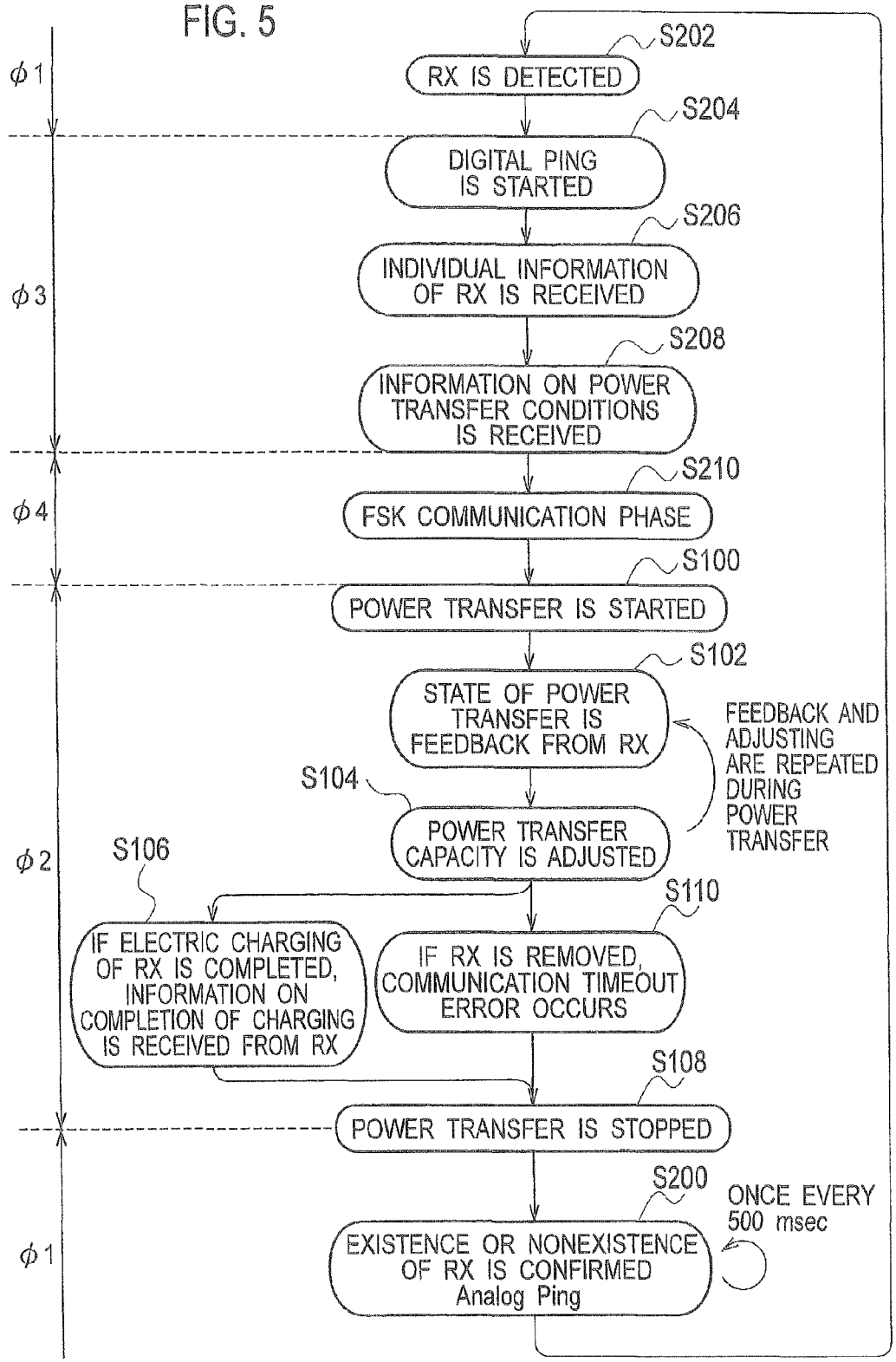
FIG. 5 is an operating sequence diagram of a transmitting device (TX) in the non-contact power supply transmitter system according to the embodiment.

FIG. 5 shows an operating sequence of the transmitting device (TX) 200 in the non-contact power supply transmitter system 100 according to the embodiment. For example, as shown in FIG. 5, the FSK communication may be executed after the identification & configuration phase φ3 between the transmitting device (TX) 200 and the receiving device (RX) 300, and before the power transfer phase φ2 from the transmitting device (TX) 200 to the receiving device (RX) 300.

More specifically, if information regarding the power transfer conditions is transmitted from the receiving device (RX) 300 to the transmitting device (TX) 200 (S208), the state of the transmitting device (TX) 200 is shifted to the FSK communication phase φ4 (S210). Subsequently, after the FSK communication is ended, the state of the transmitting device (TX) 200 is shifted to the power transfer phase φ2, and the power transfer from the transmitting device (TX) 200 to the receiving device (RX) 300 is started (S100). Other operations are similar to those of the basic technology.

(FSK Demodulation Unit: Analog Circuit)

Figure 6:
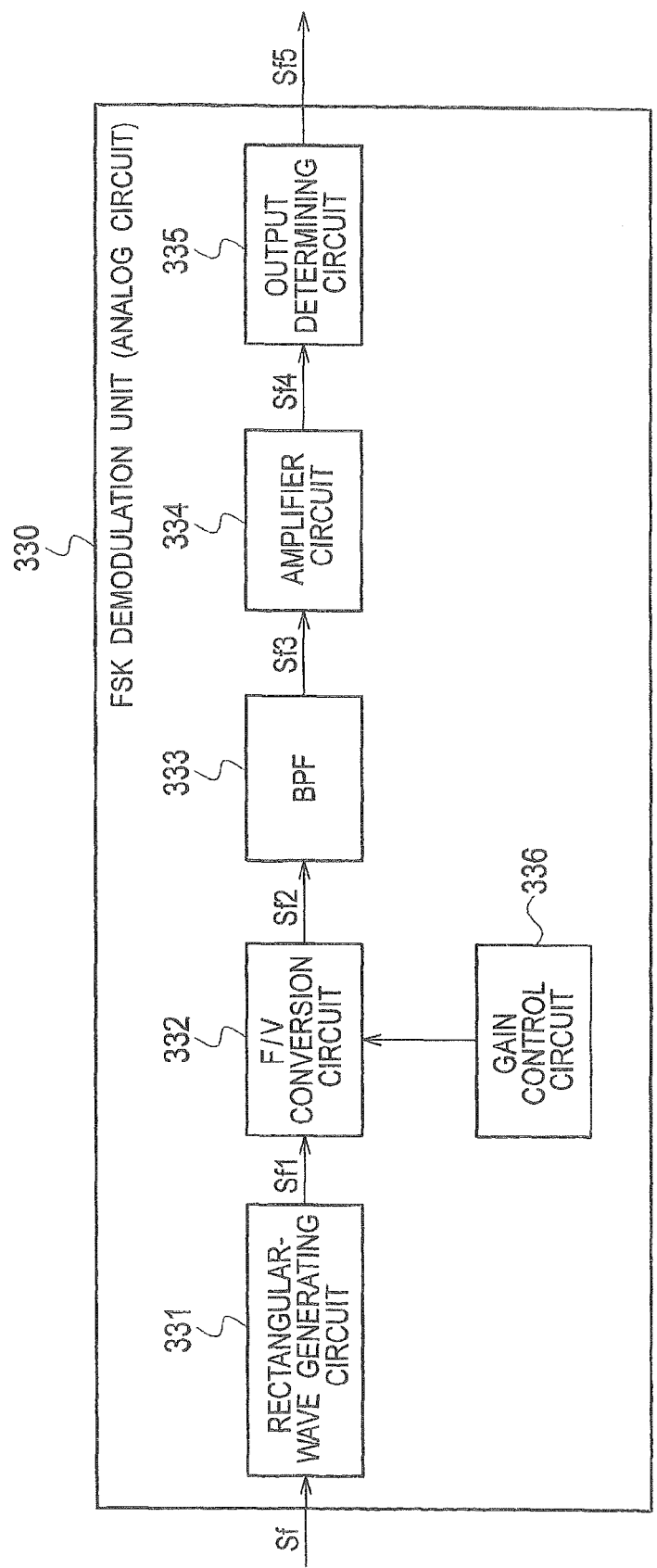
FIG. 6 is a schematic block configuration diagram of an FSK demodulation unit (analog circuit) installed in a receiving device (RX) according to an embodiment.

FIG. 6 shows a schematic block configuration of the FSK demodulation unit 330 installed in the receiving device (RX) 300 according to the embodiment. As shown in FIG. 6, the FSK demodulation unit 330 is composed of an analog circuit, and includes a rectangular-wave generating circuit 331, an F/V conversion circuit 332, a BPF 333, an amplifier circuit 334, an output determining circuit 335, and a gain control circuit 336. Such an analog circuit 330 is realized as an IC, and is mounted in the receiving device (RX) 300.

The rectangular-wave generating circuit 331 generates a rectangular wave Sf1 from the input rectification waveform (sine wave), and then outputs the generated rectangular wave Sf1, so that it becomes easy to process the input signal in the subsequent stage. The F/V conversion circuit 332 converts the variation in the frequency of the input rectangular wave Sf1 into voltage so as to be output as an F/V converted waveform Sf2. The BPF 333 allows the variation in the frequency of the input F/V converted waveform Sf2 to pass through so as to be output as a band-pass filtered waveform Sf3. Since the input band-pass filtered waveform Sf3 is minute amplitude (e.g., approximately tens of mV), the amplifier circuit 334 amplifies the variation in the frequency of the input band-pass filtered waveform Sf3 up to approximately 100 mV so as to be output as an amplified waveform Sf4. The output determining circuit 335 outputs an existence or nonexistence of the variation in the frequency of the input amplified waveform Sf4 as an FSK output waveform Sf5 which is a binary signal of "0" or "1." The gain control circuit 336 automatically controls a gain of the F/V conversion circuit 332 in accordance with the input fundamental frequency so as to correspond to the total range of the input fundamental frequencies.

(Example of Waveform)

FIG. 7 shows internal waveform examples of the FSK demodulation unit 330 installed in the receiving device (RX) 300 according to the embodiment. FIG. 7A shows an FSK original signal Sf0 used for an original of the FSK signal Sf. The FSK original signal Sf0 is a signal output from the controller 206 at the transmitting device (TX) 200 side. FIG. 7B shows a rectangular wave Sf1 output from the rectangular-wave generating circuit 331. FIG. 7C shows an F/V converted waveform Sf2 output from the F/V conversion circuit 332. FIG. 7D shows a band-pass filtered waveform Sf3 output from the BPF 333. FIG. 7E shows an amplified waveform Sf4 output from the amplifier circuit 334. FIG. 7F shows an FSK output waveform Sf5 output from the output determining circuit 335.

Figure 7A:
FIG. 7A shows an example of an internal waveform of the FSK demodulation unit (analog circuit) installed in the receiving device (RX) according to the embodiment, showing an original FSK signal waveform Sf.
Figure 7B:
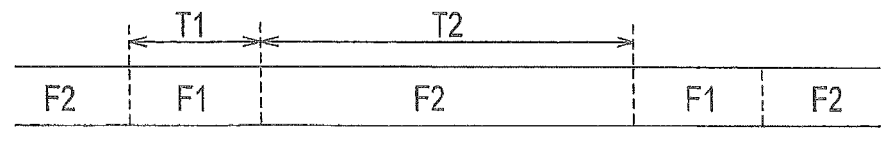
FIG. 7B shows an example of an internal waveform of the FSK demodulation unit (analog circuit) installed in the receiving device (RX) according to the embodiment, showing a rectangular-wave waveform Sf1.
Figure 7C:
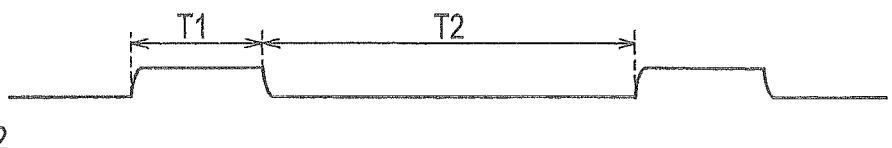
FIG. 7C shows an example of an internal waveform of the FSK demodulation unit (analog circuit) installed in the receiving device (RX) according to the embodiment, showing an F/V converted waveform Sf2.
Figure 7D:
FIG. 7D shows an example of an internal waveform of the FSK demodulation unit (analog circuit) installed in the receiving device (RX) according to the embodiment, showing a band-pass filtered waveform Sf3.
Figure 7E:
FIG. 7E shows an example of an internal waveform of the FSK demodulation unit (analog circuit) installed in the receiving device (RX) according to the embodiment, showing an amplified waveform Sf4.
Figure 7F:
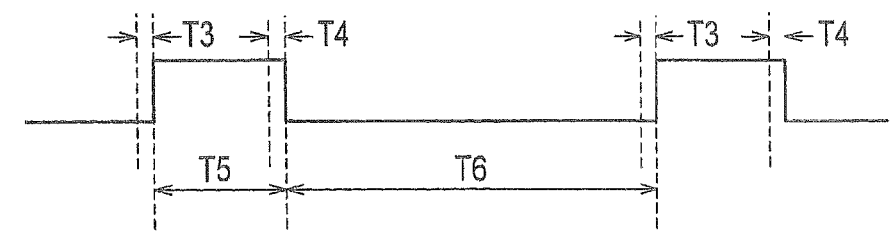
FIG. 7F shows an example of an internal waveform of the FSK demodulation unit (analog circuit) installed in the receiving device (RX) according to the embodiment, showing an SK output waveform Sf5.

As shown in FIG. 7A, it is presupposed that the FSK original signal Sf0 is at a high level in the time period T1, and is at a low level in the time period T2. Moreover, as shown in FIG. 7B, a frequency F1 of the FSK signal Sf (rectangular wave Sf1) in the time period T1 is 180 kHz, for example, and a frequency F2 of the FSK signal Sf in the time period T2 is 175 kHz. In this case, the variation in the detected frequency is amplified as shown in FIG. 7E, after the variation in the frequency are detected in the time period T3 and the time period T4 at the time when the frequency (fundamental frequency) F2 is switched to the frequency F1 as shown in FIGS. 7C and 7D. Consequently, as shown in FIG. 7F, the signal of "1" is output as the FSK output waveform Sf5 in the time period T5 (from the ending time point in the time period T3 to the ending time point in the time period T4), and the signal of "0" is output in the time period T6 as the FSK output waveform Sf5 (from the ending time point in the time period T4 to the ending time point in the following time period T3). Such the high level or low level signal is input into the controller 312 to be processed by the controller 312.

As mentioned above, according to the embodiment, the FSK demodulation unit 330 is composed of the analog circuit, and thereby the high-frequency sampling clock is unnecessary. Accordingly, since the sampling circuit 342 with large circuit size and the OSC 343 executed in MHz are not required, it becomes possible to achieve low power consumption, space-saving, and also facilitating of its design. Moreover, since the FSK demodulation unit 330 is composed the analog circuit, there also is the effect that already-existing circuits can be adapted except the FSK demodulation unit 330 even if the FSK communication is executed in the non-contact power transmitter.

As explained above, according to the embodiment, there can be provided the non-contact power supply transmitter system, the receiving device, and the analog circuit, each which can realize the low power, space-saving FSK communication.

Other Embodiments

As explained above, the embodiment has been described, as a disclosure including associated description and drawings to be construed as illustrative, not restrictive. This disclosure makes clear a variety of alternative embodiments, working examples, and operational techniques for those skilled in the art.

Such being the case, the embodiment cover a variety of embodiments, whether described or not.

What is claimed is:

1. A non-contact power supply transmitter system configured to transmit an electric power from a transmitting device to a receiving device with a non-contact power supply transmitter method, the transmitting device comprising:
a transmitting coil;
a driver configured to cause the transmitting coil to generate a power signal of an electromagnetic field; and
a frequency shift keying modulation unit configured to transmit a frequency shift keying signal through the transmitting coil, the receiving device comprising:
a receiving coil;
a frequency shift keying demodulation unit configured to demodulate the frequency shift keying signal received through the receiving coil; and
a controller configured to input the frequency shift keying signal demodulated by the frequency shift keying demodulation unit, wherein the frequency shift keying demodulation unit comprises:
a rectangular-wave generating circuit configured to input the frequency shift keying signal received through the receiving coil so as to be generated as a rectangular-wave signal therefrom, the frequency shift keying signal comprising a first level signal and a second level signal, the rectangular-wave signal comprising a first rectangular-wave signal based on the first level signal and a rectangular-wave signal based on the second level signal;

a frequency/voltage conversion circuit configured to convert a variation in a frequency of the rectangular-wave signal into voltage so as to be output as a frequency/voltage converted signal, the frequency/voltage converted signal comprising a first frequency/voltage converted signal based on the rectangular-wave signal and a second frequency/voltage converted signal based on the second above-mentioned rectangular-wave signal;

a band pass filter configured to allow the variation in the frequency of the frequency/voltage converted signal to pass through so as to be output as a band-pass-filtered signal;

an amplifier circuit configured to amplify an amplitude of the band-pass-filtered signal so as to be output as an amplified signal; and an output determining circuit configured to output an existence or nonexistence of the variation in the frequency of the amplifier circuit so as to be output as a frequency shift keying output signal, the frequency shift keying output signal being a signal of "0" or "1" wherein the amplified signal comprises a first amplified waveform having a first time period at the time of when the second frequency/voltage converted signal is switched to the first frequency/voltage converted signal, and a second amplified waveform having a second time period at the time of when the first frequency/voltage converted signal is switched to the second frequency/voltage converted signal, wherein the output determining circuit outputs one of the frequency shift keying output signal during a third time period and the frequency shift keying output signal during a fourth time period as the signal of "0", and outputs the other thereof as the signal of "1", wherein the third time period is a time period from a trailing edge of the first amplified waveform to a trailing edge of the subsequent second amplified waveform, and the fourth time period is a time period from the trailing edge of the second amplified waveform to a trailing edge of the subsequent first amplified waveform.

2. The non-contact power supply transmitter system according to claim 1, wherein
the frequency shift keying demodulation unit further comprises a gain control circuit configured to control a gain of the frequency/voltage conversion circuit in accordance with an input fundamental frequency.

3. The non-contact power supply transmitter system according to claim 1, wherein
the transmitting device executes a frequency shift keying communication after an identification & configuration phase between the transmitting device and the receiving device, and before a power transfer phase from the transmitting device to the receiving device.

4. The non-contact power supply transmitter system according to claim 1, wherein
the receiving device is mounted in any one of a non-contact power transmitter IC, a mobile phone, a tablet-type device, a smart phone, an audio player, or a game machine.

5. The non-contact power supply transmitter system according to claim 1, wherein
the band pass filter output a signal corresponding to the variation in the frequency in a time period when the frequency is switched in the frequency shift keying signal received through the receiving coil, as the band-pass-filtered signal.

6. A receiving device configured so that an electric power is transmitted from a transmitting device thereto with a non-contact power supply transmitter method, the receiving device comprising:
a receiving coil;
a frequency shift keying demodulation unit configured to demodulate the frequency shift keying signal received through the receiving coil; and
a controller configured to input the frequency shift keying signal demodulated by the frequency shift keying demodulation unit, wherein
the frequency shift keying demodulation unit comprises:
a rectangular-wave generating circuit configured to input the frequency shift keying signal received through the receiving coil so as to be generated as a rectangular-wave signal therefrom, the frequency shift keying signal comprising a first level signal and a second level signal, the rectangular-wave signal comprising a first rectangular-wave signal based on the first level signal and a rectangular-wave signal based on the second level signal;
a frequency/voltage conversion circuit configured to convert a variation in a frequency of the rectangular-wave signal into voltage so as to be output as a frequency/voltage converted signal, the frequency/voltage converted signal comprising a first frequency/voltage converted signal based on the rectangular-wave signal and a second frequency/voltage converted signal based on the second above-mentioned rectangular-wave signal;
a band pass filter configured to allow the variation in the frequency of the frequency/voltage converted signal to pass through so as to be output as a band-pass-filtered signal;
an amplifier circuit configured to amplify an amplitude of the band-pass-filtered signal so as to be output as an amplified signal; and
an output determining circuit configured to output an existence or nonexistence of the variation in the frequency of the amplifier circuit so as to be output as a frequency shift keying output signal, the frequency shift keying output signal being a signal of "0" or "1" wherein
the amplified signal comprises a first amplified waveform having a first time period at the time of when the second frequency/voltage converted signal is switched to the first frequency/voltage converted signal, and a second amplified waveform having a second time period at the time of when the first frequency/voltage converted signal is switched to the second frequency/voltage converted signal, wherein
the output determining circuit outputs one of the frequency shift keying output signal during a third time period and the frequency shift keying output signal during a fourth time period as the signal of "0", and outputs the other thereof as the signal of "1", wherein the third time period is a time period from a trailing edge of the first amplified waveform to a trailing edge of the subsequent second amplified waveform, and the fourth time period is a time period from the trailing edge of the second amplified waveform to a trailing edge of the subsequent first amplified waveform.

7. The receiving device according to claim 6, wherein
the frequency shift keying demodulation unit further comprises a gain control circuit configured to control a gain of the frequency/voltage conversion circuit in accordance with an input fundamental frequency.

8. The receiving device according to claim 6, wherein
the transmitting device executes a frequency shift keying communication after an identification & configuration phase between the transmitting device and the receiving device, and before a power transfer phase from the transmitting device to the receiving device.

9. The receiving device according to claim 6, wherein
the receiving device is mounted in any one of a non-contact power transmitter IC, a mobile phone, a tablet-type device, a smart phone, an audio player, or a game machine.

10. The receiving device according to claim 6, wherein
the band pass filter output a signal corresponding to the variation in the frequency in a time period when the frequency is switched in the frequency shift keying signal received through the receiving coil, as the band-pass-filtered signal.

* * * * *